(12) United States Patent
Rose

(10) Patent No.: US 6,560,751 B1
(45) Date of Patent: May 6, 2003

(54) TOTAL OVERLAY FEED FORWARD METHOD FOR DETERMINATION OF SPECIFICATION SATISFACTION

(75) Inventor: John Douglas Rose, Mico, TX (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

(21) Appl. No.: 09/992,589

(22) Filed: Nov. 6, 2001

(51) Int. Cl.$^7$ .............................................. G06F 17/50
(52) U.S. Cl. ............................................. 716/1; 703/14
(58) Field of Search ...................... 716/1, 2–21; 703/14, 703/17

(56) References Cited

U.S. PATENT DOCUMENTS

| | | | |
|---|---|---|---|
| 6,336,056 B1 | * | 1/2002 | Fujimoto et al. ............ 700/121 |
| 6,366,874 B1 | * | 4/2002 | Lee et al. ...................... 703/14 |
| 2002/0013930 A1 | * | 1/2002 | Inanami et al. ................ 716/1 |
| 2002/0051564 A1 | * | 5/2002 | Benesch et al. ............ 382/145 |
| 2002/0053045 A1 | * | 5/2002 | Gillenwater et al. .......... 714/38 |
| 2002/0069396 A1 | * | 6/2002 | Bhattacharya et al. ......... 716/7 |
| 2002/0103557 A1 | * | 8/2002 | Land ............................ 700/96 |
| 2002/0103558 A1 | * | 8/2002 | Iwamasa ....................... 700/97 |
| 2002/0111784 A1 | * | 8/2002 | Keller et al. .................. 703/14 |
| 2002/0138516 A1 | * | 9/2002 | Igra ............................ 707/513 |
| 2002/0143483 A1 | * | 10/2002 | Ono et al. ..................... 702/83 |
| 2002/0143511 A1 | * | 10/2002 | Iwamasa ....................... 703/17 |
| 2002/0156929 A1 | * | 10/2002 | Hekmatpour ............... 709/310 |

* cited by examiner

*Primary Examiner*—Vuthe Siek
*Assistant Examiner*—Magid Y Dimyan
(74) *Attorney, Agent, or Firm*—Mayer Fortkort & Williams, PC; John A. Fortkort, Esq.

(57) ABSTRACT

A method for determining compliance with design specifications is provided. In accordance with the method, a product is provided which is characterized by k parameters, $k \geq 2$, wherein, for n=1 to k, the $n^{th}$ parameter has a design specification $P_{nDesign}$ and an actual value of $P_{nActual}$, and wherein $d_n = P_{nDesign} - P_{nActual}$. The value of $$\Delta_{Actual} = \left[\sum_{n=1}^{k} d_n^2\right]^{1/2}$$

is then determined. If $\Delta_{Actual} \leq \Delta_{Design}$, where $\Delta_{Design}$ is the total design tolerance for the product, then the product is deemed to comply with design specifications.

22 Claims, 1 Drawing Sheet

US 6,560,751 B1

TOTAL OVERLAY FEED FORWARD METHOD FOR DETERMINATION OF SPECIFICATION SATISFACTION

FIELD OF THE INVENTION

The present invention relates generally to methods for manufacturing semiconductor devices, and more particularly to a method for determining the satisfaction of total overlay during the manufacture of semiconductor devices.

BACKGROUND OF THE INVENTION

The manufacture of semiconductor devices such as microprocessors involves the use of photolithography to impart detailed circuit patterns onto silicon dioxide layers disposed on a silicon wafer substrate. A typical microprocessor comprises many such layers, and is built up layer by layer, with each layer on the microprocessor potentially having a different circuit pattern.

The ultimate performance characteristics of the device are greatly affected by the overlay between adjacent layers in the device. One factor affecting overlay is the degree of misalignment between adjacent layers. If adjacent layers do not achieve the proper alignment tolerance, a large number of device defects can result, and the functionality of the device will be diminished.

An optical overlay measurement tool is often used to determine the degree of misalignment between adjacent layers during the manufacture of a semiconductor device. The tool can be adapted to use a number of commercially available techniques to generate alignment signals which indicate the position of a given layer relative to an adjacent layer or to the wafer substrate. The alignment signals are typically produced by optical measurement of alignment patterns. These alignment patterns typically consist of a series of marks which are etched onto a particular layer by photolithography such that the marks can be readily identified by the tool during the measurement process.

The process of measuring the degree of misalignment between two layers by means of alignment marks is known as registration. Registration involves comparing the position of a layer to that of a previous layer (or to the wafer substrate) by determining the misplacement between the alignment marks on the surfaces of the two layers. During registration, the degree of misalignment is determined by using the alignment marks to quantify the displacement between adjacent layers with respect to each of two orthogonal axes (e.g., the x-axis and the y-axis). The misalignment between the two layers is then typically taken as the larger of these two measurements.

While the procedure described above can control alignment errors that occur during the manufacture of the semiconductor device, it does not take into account other types of errors that can occur. For example, the total overlay between adjacent layers can also be affected by deviations in the size of the printed circuits on each of the adjacent layers as compared to the sizes of these circuits set forth in the device specifications. Moreover, while these and other parameters have been considered in the past in determining compliance with device specifications, they have been considered in isolation, such that the device is deemed defective if any one of these parameters individually falls outside of design tolerances. In fact, however, the present inventors have found that these parameters are interrelated, and that this interrelation must be taken into account for a truly accurate determination of compliance with device specifications and of the total overlay between two adjacent layers in the device.

There is thus a need in the art for a method for determining compliance with design specifications during the manufacture of an article, such as a semiconductor device, which takes into account the various parameters of the device affecting overlay as well as the interrelation between these parameters. These and other needs are met by the present invention, as hereinafter described.

SUMMARY OF THE INVENTION

In one aspect, the present invention relates to a method for determining compliance with design specifications in a product. In accordance with the method, a product is provided which is characterized by k parameters, $k \geq 2$, wherein, for $n=1$ to $k$, the $n^{th}$ parameter has a design specification value $P_{nDesign}$ and an actual value of $P_{nActual}$, and wherein $d_n = P_{nDesign} - P_{nActual}$. The value of $$\Delta_{Actual} = \left[\sum_{n=1}^{k} d_n^2\right]^{1/2}$$

is then determined. If $\Delta_{Actual} \leq \Delta_{Design}$, where $\Delta_{Design}$ is the total design tolerance for the product, then the product is deemed to comply with design specifications. This methodology may be applied, for example, to the manufacture of a semiconductor device, where it may be implemented as part of an automated process.

In another aspect, the present invention relates to a method for determining compliance with product specifications in the manufacture of a semiconductor device. In accordance with the method, a semiconductor device is provided which comprises first and second adjacent layers, wherein the first and second layers have first and second circuit patterns disposed thereon, respectively. The value of $\Delta_{Actual}$ is then determined, wherein $$\Delta_{Actual} = [d_1^2 + d_2^2 + d_3^2]^{1/2}$$

and wherein $d_1 = P_{1Design} - P_{1Actual}$;

$d_2 = P_{2Design} - P_{2Actual}$;

$d_3$ is the misalignment between the first and second patterns;

$P_{1Design}$ is the dimension of the first pattern along a first axis as per design specifications;

$P_{1Actual}$ is the dimension of the first pattern along the first axis as actually measured;

$P_{2Design}$ is the dimension of the second pattern along the first axis as per design specifications; and $P_{2Actual}$ is the dimension of the second pattern along the first axis as actually measured.

The value of $\Delta_{Actual}$ is preferably calculated after each layer is added to the semiconductor device, in which case the second layer is taken as the most recently added layer and the first layer is taken as the layer upon which the second layer is disposed. If $\Delta_{Actual} \leq \Delta_{Design}$, where $\Delta_{Design}$ is the total design tolerance for each layer pair in the device, then the device may be passed onto the next processing step. If $\Delta_{Actual} > \Delta_{Design}$, the device may be either scrapped or reworked.

In still another aspect, the present invention relates to a method for manufacturing a multilayer semiconductor device. In accordance with the method, a substrate, such as a silicon wafer, is provided. A first layer having a first printed circuit pattern thereon is then deposited or formed on the substrate. Then, for $n=2$ to $k$, where $k \geq 2$, the following steps are performed for so long as $\Delta_{Actual<n|n-1>} \leq \Delta_{Design}$, where $\Delta_{Actual<n|n-1>}$ is the total overlay between the nth and (n−1)th layers:

(a) an nth layer is deposited or formed on the substrate, and (b) the value of $$\Delta_{Actual<n|n-1>} = [d_1^2 + d_2^2 + d_3^2]^{1/2}$$

is determined, wherein $d_1 = P_{n-1Design} - P_{n-1Actual}$,
$d_2 = P_{nDesign} - P_{nActual}$,
$d_3$ is the misalignment between the (n−1)th and the nth patterns,
$P_{n-1Design}$ is the dimension of the (n−1)th pattern along a first axis as per design specifications,
$P_{n-1Actual}$ is the dimension of the (n−1)th pattern along the first axis as actually measured,
$P_{nDesign}$ is the dimension of the nth pattern along the first axis as per design specifications,
$P_{nActual}$ is the dimension of the nth pattern along the nth axis as actually measured, and
$\Delta_{Design}$ is the total design tolerance established for the semiconductor device.

In the event that $\Delta_{Actual<n|n-1>} >> \Delta_{Design}$ for any layer pair, the device may be scrapped, or it may be reworked until $\Delta_{Actual<n|n-1>} \leq \Delta_{Design}$, in which case the method is continued until n=k.

In yet another aspect, the present invention relates to a software program disposed in a tangible medium, and containing instructions adapted to implement any of the above described methods.

DETAILED DESCRIPTION

Figure 1:
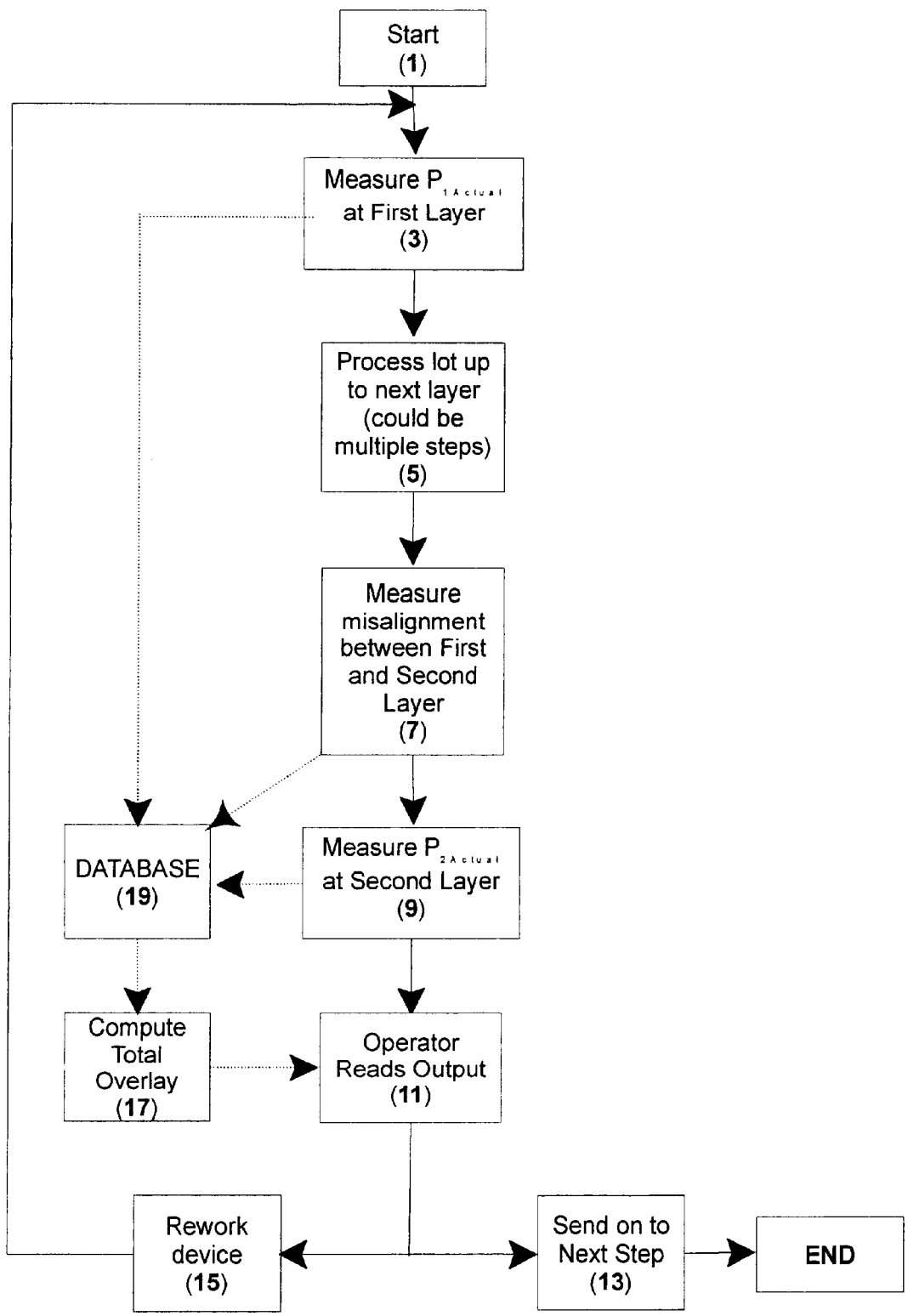
FIG. 1 is a flowchart illustrating one embodiment of the methodology of the present application.

The present invention provides a method for determining compliance with design specifications during the manufacture of an article such as, for example, a semiconductor device. The method takes into account the various parameters of the device affecting compliance with design specifications, as well as the interrelation between these parameters. In the context of a semiconductor device having two or more adjacent overlying layers, for example, the method takes into account the various parameters affecting total overlay between these layers, as well as the interrelation between these parameters.

The manufacture of semiconductor devices such as microprocessors involves the use of photolithography to impart detailed circuit patterns onto silicon dioxide layers disposed on a silicon wafer substrate. A typical microprocessor comprises many such layers, and is built up layer by layer, with each layer on the microprocessor potentially having a different circuit pattern.

The manufacture of the semiconductor device typically starts with a single-crystal cylinder of pure silicon about six to eight inches in diameter. Methods of growing such crystals are well known in the art. The cylinder is sliced into thin, highly polished wafers that are typically less than one-fortieth of an inch in thickness. The size of these wafers may vary, but the use of six and eight inch wafers is common in the industry. The circuit elements, which include the transistors, resistors, and capacitors, are built up in layers on the silicon wafer in subsequent processing steps.

A design for the semiconductor device, including the circuit designs for the various layers in the device, can be developed with the help of a computer-aided design (CAD) system. When the circuit designs for the device have been developed, they are typically subjected to several cycles of simulation tests and design modifications before the design is perfected and the device is actually built.

When the design for the device is complete, glass photomasks are made. Typically, one mask is required for each layer of the circuit. Each mask defines different parts of the transistors, capacitors, resistors, and connectors that make up the completed device, as well as the circuitry pattern for each layer within the device. The masks are used in a multiple-step photolithography process that is repeated once for each mask required by the device circuitry.

At the beginning of the manufacturing process, the silicon wafer is exposed to oxygen at temperatures of 900° C. or higher, resulting in the formation of a layer of silicon dioxide (glass). The exposure time may vary depending, for example, on how thick a layer of glass is required. A layer of nitride may then be disposed on the glass by similarly heating the silicon wafer in a nitrogen atmosphere.

Next, the wafer is coated with a light-sensitive liquid called a photoresist. Portions of the wafer are selected for exposure by carefully aligning one of the masks between an ultraviolet light source and the wafer. The photoresist may be negative or positive. In the case of a negative photoresist, light passes through the transparent areas of the mask and exposes the photoresist, causing it to harden and become impervious to etchants. This chemical change allows a developer solution which is subsequently applied to remove the unexposed photoresist while leaving the hardened, exposed photoresist behind on the wafer. Positive photoresists, which are more commonly used than negative photoresists, act in the opposite fashion. In particular, positive photoresists are insoluble until they are exposed, at which point the exposed portions of the photoresist are rendered soluble in the developer solution (e.g., TMAH) and can be removed.

The wafer is then subjected to an etching process to remove the portion of the nitride layer that is not protected by the hardened photoresist. Etching may be effected through the use of an acid such as hydrofluoric acid, or through the use of a plasma. When the etching process is completed, a nitride pattern is left behind on the wafer which corresponds to the design on the mask. The hardened photoresist is subsequently removed, typically by chemical treatment.

Dopants are frequently introduced as part of the layer formation in high temperature diffusion operations or with ion implanters. These dopants are used to tailor the silicon's conductive characteristics by making it either negative (n-type) or positive (p-type).

These basic steps are repeated for the additional layers of polysilicon, glass, and aluminum which make up the completed device. The finished wafer is an intricate multilayer construction of n-type and p-type silicon and insulating layers of glass and silicon nitride.

All of the circuit elements, including the transistors, resistors, and capacitors, are constructed during the initial series of masking operations. The subsequent masking steps serve to connect these circuit elements together. An insulating layer of glass known as BPSG is deposited and a contact mask is used to define the contact points or windows of each of the circuit elements. After the contact windows are etched, the device is placed in a sputtering chamber, and a metal mask is used to impart to the device a fine network of thin metal (typically aluminum) connections or wires. The entire wafer is then covered with an insulating layer of glass and silicon nitride, called a passivation layer, to protect it from contamination during assembly. The final mask and passivation etch removes the passivation material from the terminals or bonding pads of the device. The bonding pads are used to electrically connect the die to the metal pins of the plastic or ceramic package.

While still on the wafer, every integrated circuit is tested and functional and nonfunctional chips are identified and mapped into a computer data file or database. A diamond saw is then used to cut the wafer into individual chips. Nonfunctional chips are discarded or reworked, and the rest are assembled into plastic or ceramic packages. Thin gold wires are typically used to connect the bonding pads on the chip to the metal pins on the package.

Since the features of semiconductor devices are so small and are built up in a layerwise fashion, the performance characteristics of these devices are greatly affected by even relatively minute deviations from design specifications in adjacent layers. Therefore, it is necessary to measure the parameters that affect performance characteristics after each layer is constructed so that the device can be reworked if a particular layer in the device is found to be outside of specifications. In the ensuing discussion, the layer most recently formed is referred to as the second layer, and the circuit pattern disposed thereon is referred to as the second pattern. Similarly, the adjacent layer on which the second layer is disposed is referred to as the first layer, and the circuit patter disposed thereon is referred to as the first pattern.

The performance characteristics of semiconductor devices produced by the type of process described above are greatly affected by the overlay between adjacent layers in the device. In accordance with the present invention, the total overlay $\Delta_{Actual}$ between adjacent layers in a semiconductor device has been determined to be a function of three major factors. These are: (1) the actual dimensions of the circuit pattern in the first layer as compared to the dimensions set forth in the specifications; (2) the actual dimensions of the circuit pattern in the second layer as compared to the dimensions set forth in the specifications; and (3) the degree of misalignment between the two patterns. These factors are interrelated as specified by the following formula:

$$\Delta_{Actual} = [d_1^2 + d_2^2 + d_3^2]^{1/2} \quad \text{(FORMULA I)}$$

wherein $d_1 = P_{1Design} - P_{1Actual}$;

$d_2 = P_{2Design} - P_{2Actual}$;

$d_3$ is the misalignment between the first and second patterns;

$P_{1Design}$ is the dimension of the first pattern along a first axis as per design specifications;

$P_{1Actual}$ is the dimension of the first pattern along the first axis as actually measured;

$P_{2Design}$ is the dimension of the second pattern along the first axis as per design specifications; and $P_{2Actual}$ is the dimension of the second pattern along the first axis as actually measured.

In accordance with the present invention, the value of $\Delta_{Actual}$ may be determined to evaluate the total overlay between any two adjacent layers in a semiconductor device. Preferably, $\Delta_{Actual}$ is determined after the formation of each layer in the device and is compared to $\Delta_{Design}$, the total design tolerance specified for the layer pair consisting of the most recently formed layer and the layer adjacent to it. If $\Delta_{Actual} \leq \Delta_{Design}$, where $\Delta_{Design}$ is the total design tolerance for each layer pair in the device, then the device may be passed onto the next processing step. If $\Delta_{Actual} > \Delta_{Design}$, the device may be either scrapped or reworked.

In most semiconductor manufacturing processes, $d_1$, $d_2$ and $d_3$ are the dominant factors affecting overlay, and other factors which might also affect the total overlay can be neglected to a good degree of accuracy. In the event that other factors are found to significantly affect the total overlay, however, they can be taken into account by extension of FORMULA I. Thus, for example, if a parameter $d_4$ is also found to significantly affect the total overlay, the following formula can be used:

$$\Delta_{Actual} = [d_1^2 + d_2^2 + d_3^2 + d_4^2]^{1/2} \quad \text{(FORMULA II)}$$

wherein $d_1$, $d_2$ and $d_3$ are defined as above. This formula can be further generalized, if needed, to FORMULA III, which is discussed below.

In a semiconductor device, a circuit pattern on a particular layer may be displaced with respect to the circuit pattern on the underlying layer along either of two orthogonal axes (e.g., an x-axis and a y-axis) aligned with the major axes of the underlying pattern. The displacement along a given axis may be determined by reference to an alignment mark. As used herein, the "misalignment" between the first and second patterns refers to the larger of these two displacements. Of course, it will be appreciated that other methods for determining misalignment could be utilized without departing from the scope of the present invention.

The use of FORMULA I, II or III in the manufacture of a semiconductor device has certain implications. If, for example, $d_1$ is relatively large, but $d_2$ and $d_3$ are relatively small, the total overlay may still fall within design tolerances. Hence, it is the relationship between these three parameters that is used in the present invention to determine specification compliance. By contrast, prior art methods of assessing specification compliance have considered factors such as these in isolation.

In order to implement the methodology of the present invention, some empirically determined parameters are needed. Thus, for example, if FORMULA I is to be employed, three empirically determined parameters are needed: $P_{1Actual}$, $P_{2Actual}$, and $d_3$ (a fourth parameter, $d_4$, will need to be determined if FORMULA II is to be utilized, while a total of n empirically determined parameters may be needed if FORMULA III is used). $P_{1Actual}$ and $P_{2Actual}$ may be readily ascertained through microscopy or other methods of visual inspection as are known to the art, and $d_3$ may be determined by registration and the use of alignment marks or other registration structures, using the procedures described above. Registration structures suitable for this purpose include, for example, box-in-box, visual verniers, Automatic Measurement System ("AMS") and Canomap, each of which uses a different type of structure or pattern for comparison. The remaining parameters, $P_{1Design}$ and $P_{2Design}$, are predetermined fixed values which are set forth in the design specifications, as is $\Delta_{Design}$.

FIG. 1 is a flowchart which illustrates one particular application of the methodology of the present invention to the manufacture of a semiconductor device. At the beginning 1 of the process, a semiconductor device is provided which contains at least a first circuit pattern. The semiconductor device provided may be at any stage in its manufacture in which there is at least a first circuit pattern already on the device and at least a second circuit pattern which needs to be laid over the first circuit pattern in a subsequent processing step.

At least one dimension $P_{1Actual}$ of the first pattern is then measured 3. This dimension may be, for example, the length, width, or diagonal of the first circuit pattern, or a dimension of a particular element or indicator mark disposed in the first circuit pattern. Preferably, however, the dimension is sufficiently large so that error in the measurement is minimized. The result is then stored in a database 19. While this dimensional measurement can be made manually, it is preferably made in an automated process, as by a computer controlled electron microscope built into the assembly line, and the result is automatically fed to the database.

The device is then processed up to the point at which a second pattern is disposed over the first pattern 5. As noted above in the description of semiconductor processing, this point may require multiple processing steps to attain. At this point, the misalignment M between the first and second circuit patterns is measured 7 using the methodology described above, and the result is input into the database. Preferably, both the measurement of M and the input of the value of M into the database are also automated.

Next, at least one dimension $P_{2Actual}$ of the second pattern is measured 9. As with the measurement made on the first pattern, this dimension may be, for example, the length, width, or diagonal of the second circuit pattern, or a dimension of a particular element or indicator mark disposed in the second circuit pattern. Preferably, however, the same type of dimension is measured on both the first and second patterns (e.g., the width of the adjacent sides of the first and second circuit patterns). This result is also input into the database, and the actual overlay ($\Delta_{Actual}$), which represents the total deviation from design, is determined in accordance with FORMULA I (if FORMULA II or III is used, further measurements will be necessary to determine the required parameters). The calculation of $\Delta_{Actual}$ will typically be performed by a computer. The computer may also be adapted to record other process variables, such as temperature, pressure, humidity, date, and time, and may be adapted to create tables, charts, or other renderings based on the data.

The process operator (which may be a computer in the case of an automated process) then reads the output 11. If $\Delta_{Actual}$ is within an acceptable range (that is, if $\Delta_{Actual} \leq \Delta_{Design}$, where $\Delta_{Design}$ is the total design tolerance for each layer pair in the device), the operator sends the device on to the next step for further processing 13. If $\Delta_{Actual}$ is not within an acceptable range, the device is reworked or scrapped 15. An acceptable range for $\Delta_{Actual}$ may vary from one device to another, and may also vary from one processing step or layer to another. Preferably, this determination is made in real time to control whether a part or product should be held in the production line or sent on to the next process step.

The present invention has been illustrated with respect to a specific application in the manufacture of semiconductor devices. However, it will be appreciated that the methodology employed herein may be applied to many other types of manufacturing processes wherein products are manufactured to a specification or for which an overall specification can be established, or wherein variations in properties or dimensions of the components of the product are interrelated. Thus, for example, the methodology could be utilized in the manufacture of multicomponent machines or devices, or in multistep industrial processes. The methodology could also be adapted to the manufacture of semiconductor or other silicon-based devices in which interrelated parameters other than those described above need to be considered.

Consider, for example, a product or process which is characterized by k parameters, $k \geq 2$, and wherein, for n=1 to k, the $n^{th}$ parameter has a design specification value $P_{nDesign}$ and an actual value of $P_{nActual}$, and wherein $d_n = P_{nDesign} - P_{nActual}$. The value of $\Delta_{Actual}$ may then be determined by the equation $$\Delta_{Actual} = \left[\sum_{n=1}^{k} d_n^2\right]^{1/2} \quad \text{(Formula III)}$$

If $\Delta_{Actual} \leq \Delta_{Design}$, where $\Delta_{Design}$ is the total design tolerance for the product or process, then the product or process is deemed to comply with the design specification.

Although various embodiments are specifically illustrated and described herein, it will be appreciated that modifications and variations of the invention are covered by the above teachings and within the purview of the appended claims without departing from the spirit and intended scope of the invention. For example, while several of the embodiments depict the use of specific data formats and protocols, any formats or protocols may suffice. Moreover, while some of the embodiments describe specific embodiments of computer, clients, servers, etc., other types may be employed by the invention described herein. Furthermore, these examples should not be interpreted to limit the modifications and variations of the invention covered by the claims but are merely illustrative of possible variations.

What is claimed is:

1. A method for determining compliance with design specifications, comprising the steps of:

providing a product characterized by k parameters, $k \geq 2$, wherein, for n=1 to k, the $n^{th}$ parameter has a design specification $P_{nDesign}$ and an actual value of $P_{nActual}$, and wherein $d_n = P_{nDesign} - P_{nActual}$; and determining the value of $$\Delta_{Actual} = \left[\sum_{n=1}^{k} d_n^2\right]^{1/2}.$$

2. The method of claim 1, wherein the product has a total design specification of $\Delta_{Design}$, and wherein the product is deemed to comply with design specifications so long as $\Delta_{Design} \geq \Delta_{Actual}$.

3. The method of claim 1, wherein the k parameters are interrelated.

4. The method of claim 1, wherein $k \geq 3$.

5. The method of claim 1, wherein the product is a semiconductor device.

6. The method of claim 5, wherein the semiconductor has first and second adjacent layers, wherein the first layer has a first circuit pattern disposed thereon, and wherein the second layer has a second circuit pattern disposed thereon.

7. The method of claim 6, wherein $P_{1Design}$ is the dimension of the first pattern along a first axis as per design specifications, wherein $P_{1Actual}$ is the dimension of the first pattern along the first axis as actually measured.

8. The method of claim 7, wherein $P_{2Design}$ is the dimension of the second pattern along the first axis as per design specifications, wherein $P_{2Actual}$ is the dimension of the second pattern along the first axis as actually measured.

9. The method of claim 8, wherein $P_{3Design}$ is the misalignment between the first and second patterns as per design specifications, and wherein $P_{3Actual}$ is the misalignment between the first and second patterns as actually measured.

10. The method of claim 9, wherein $P_{3Actual}$ is the larger of $|P_{3Ax}|$ and $|P_{3Ay}|$, wherein $P_{3Ax}$ is the vector component parallel to the first axis of the displacement between corresponding points on the first and second layers, and wherein $P_{3Ay}$ is the vector component parallel to the second axis of the displacement between corresponding points on the first and second layers.

11. The method of claim 9, wherein k=3.

12. A software program disposed in a tangible medium, the program containing instructions adapted to implement the method of claim 1.

13. A method for determining compliance with product specifications in the manufacture of a semiconductor device, the method comprising the steps of:
   providing a semiconductor device comprising first and second adjacent layers, said first and second layers having first and second circuit patterns disposed thereon, respectively; and
   determining the value of $\Delta_{Actual}$, where $$\Delta_{Actual} = [d_1^2 + d_2^2 + d_3^2]^{1/2}$$

and wherein
   $d_1 = P_{1Design} - P_{1Actual}$;
   $d_2 = P_{2Design} - P_{2Actual}$;
   $d_3$ is the misalignment between the first and second patterns;
   $P_{1Design}$ is the dimension of the first pattern along a first axis as per design specifications;
   $P_{1Actual}$ is the dimension of the first pattern along the first axis as actually measured;
   $P_{2Design}$ is the dimension of the second pattern along the first axis as per design specifications; and
   $P_{2Actual}$ is the dimension of the second pattern along the first axis as actually measured.

14. The method of claim 13, wherein $P_{3Actual}$ is the larger of $|P_{3Ax}|$ and $|P_{3Ay}|$, wherein $P_{3Ax}$ is the vector component parallel to the first axis of the displacement between corresponding points on the first and second layers, and wherein $P_{3Ay}$ is the vector component parallel to the second axis of the displacement between corresponding points on the first and second layers.

15. A software program disposed in a tangible medium, the program containing instructions adapted to implement the method of claim 13.

16. A method for manufacturing a multilayer semiconductor device, comprising the steps of:
   providing a substrate;
   depositing a first layer on the substrate, said first layer having a first circuit pattern disposed thereon; and
   for n=2 to k, where k≥2, performing the following steps so long as $\Delta_{Actual} < n|n-1> \leq \Delta_{Design}$:
   (a) depositing an nth layer on the substrate, and
   (b) determining the value of $$\Delta_{Actual} < n|n-1> = [d_1^2 + d_2^2 + d_3^2]^{1/2}$$

wherein
   $d_1 = P_{n-1\ Design} - P_{n-1\ Actual}$,
   $d_2 = P_{nDesign} - P_{nActual}$,
   $d_3$ is the misalignment between the (n−1)th and the nth patterns,
   $P_{n-1\ Design}$ is the dimension of the (n−1)th pattern along a first axis as per design specifications,
   $P_{n-1\ Actual}$ is the dimension of the (n−1)th pattern along the first axis as actually measured,
   $P_{nDesign}$ is the dimension of the nth pattern along the first axis as per design specifications,
   $P_{nActual}$ is the dimension of the nth pattern along the nth axis as actually measured, and
   $\Delta_{Design}$ is the total design tolerance established for the semiconductor device.

17. The method of claim 16, wherein $P_{n-1\ Design}$ is the dimension of the (n−1)th pattern along the first axis as per design specifications, and wherein $P_{n-1\ Actual}$ is the dimension of the (n−1)th pattern along the first axis as actually measured.

18. A manufacturing process employing the method of claim 16, wherein the device is removed from the process if $\Delta_{Actual} < n|n-1> \geq \Delta_{Design}$.

19. The method of claim 16, wherein $P_{n-1\ Actual}$ is the larger of $|P_{n-1Ax}|$ and $|P_{n-1\ Ay}|$, wherein $P_{n-1\ Ax}$ is the vector component parallel to the first axis of the displacement between corresponding points on the (n−1)th and nth layers, and wherein $P_{n-1\ Ay}$ is the vector component parallel to the second axis of the displacement between corresponding points on the first and second layers.

20. The method of claim 16, wherein the substrate is a silicon wafer.

21. The method of claim 16, wherein the semiconductor device is a microprocessor.

22. A software program disposed in a tangible medium, the program containing instructions adapted to implement the method of claim 16.

* * * * *

UNITED STATES PATENT AND TRADEMARK OFFICE
CERTIFICATE OF CORRECTION

PATENT NO. : 6,560,751 B1
DATED : May 6, 2003
INVENTOR(S) : John Douglas Rose

It is certified that error appears in the above-identified patent and that said Letters Patent is hereby corrected as shown below:

Column 2,
Line 37, change the formula "$\Delta_{Actual} = [d_1^2 + d_2^2 + d_3^2]1/12$" to
-- $\Delta_{Actual} = [d_1^2 + d_2^2 + d_3^2]^{1/2}$ --.

Column 3,
Line 8, change the formula "$\Delta_{Actual}\langle n|n-1\rangle = [d_1^2 + d_2^2 + d_3^2]1/2$" to
-- $\Delta_{Actual}\langle n|n-1\rangle = [d_1^2 + d_2^2 + d_3^2]^{1/2}$ --.

Column 4,
Line 17, after "900º C" delete -- . --.

Column 5,
Line 31, after "circuit," change "patter" to -- pattern --.
Line 47, change the formula "$\Delta_{Actual} = [d_1^2 + d_2^2 + d_3^2]1/2$" to
-- $\Delta_{Actual} = [d_1^2 + d_2^2 + d_3^2]^{1/2}$ --

Column 6,
Line 17, change the formula "$\Delta_{Actual} = [d_1^2 + d_2^2 + d_3^2]1/2$" to
-- $\Delta_{Actual} = [d_1^2 + d_2^2 + d_3^2]^{1/2}$ --
Line 54, after "visual", change "verniers" to -- verniers --.

Column 8,
Line 3, after "value", change "$P_{Design}$" to -- $P_{nDesign}$ --.

Signed and Sealed this

Thirtieth Day of September, 2003

JAMES E. ROGAN
*Director of the United States Patent and Trademark Office*